United States Patent
Zhang

(10) Patent No.: US 11,853,183 B2
(45) Date of Patent: Dec. 26, 2023

(54) DEVICE FOR TRANSMITTING COMMANDS WITH CIRCUIT OF CIRCUIT BOARD TO TEST CONNECTION INTERFACE, SYSTEM AND METHOD THEREOF

(71) Applicants: Inventec (Pudong) Technology Corporation, Shanghai (CN); Inventec Corporation, Taipei (TW)

(72) Inventor: Tian-Chao Zhang, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 162 days.

(21) Appl. No.: 17/701,383

(22) Filed: Mar. 22, 2022

(65) Prior Publication Data
US 2023/0297481 A1   Sep. 21, 2023

(30) Foreign Application Priority Data
Mar. 18, 2022   (CN) .......................... 202210269706.2

(51) Int. Cl.
| G06F 11/00 | (2006.01) |
| G06F 11/27 | (2006.01) |
| G01R 31/3187 | (2006.01) |

(52) U.S. Cl.
CPC .......... G06F 11/27 (2013.01); G01R 31/3187 (2013.01)

(58) Field of Classification Search
CPC ............................ G06F 11/27; G01R 31/3187
See application file for complete search history.

(56) References Cited

U.S. PATENT DOCUMENTS

| 7,073,094 | B1 * | 7/2006 | Jackson | .................. G06F 11/27 |
| | | | | 714/E11.169 |
| 10,678,667 | B1 * | 6/2020 | Majerus | ..................... G06F 1/28 |
| 11,442,844 | B1 * | 9/2022 | Peattie | ..................... G06F 11/27 |
| 2004/0225783 | A1 * | 11/2004 | Erickson | .................. G06F 11/27 |
| | | | | 714/E11.169 |
| 2014/0058699 | A1 * | 2/2014 | Okamoto | ....... G01R 31/318547 |
| | | | | 702/118 |
| 2015/0089289 | A1 * | 3/2015 | Gahoi | ..................... G06F 11/27 |
| | | | | 714/30 |
| 2019/0170819 | A1 * | 6/2019 | Friedman | ....... G01R 31/318597 |

* cited by examiner

*Primary Examiner* — Joshua P Lottich
(74) *Attorney, Agent, or Firm* — David R. Stevens; Stevens Law Group

(57) ABSTRACT

A device for transmitting commands with a circuit of a circuit board to test a connection interface, a system and a method thereof are disclosed. In the system, an inter-integrated circuit (I2C) of the circuit board under test is used to transmit an control command to a test device, which is connected to the inter-integrated circuit via a memory connection interface of the circuit board under test, the test device converts the control command to test the memory connection interface connected thereto, so as to achieve the technical effect of improving test efficiency in testing the memory connection interface of the circuit board under test without using an external connection line.

10 Claims, 4 Drawing Sheets

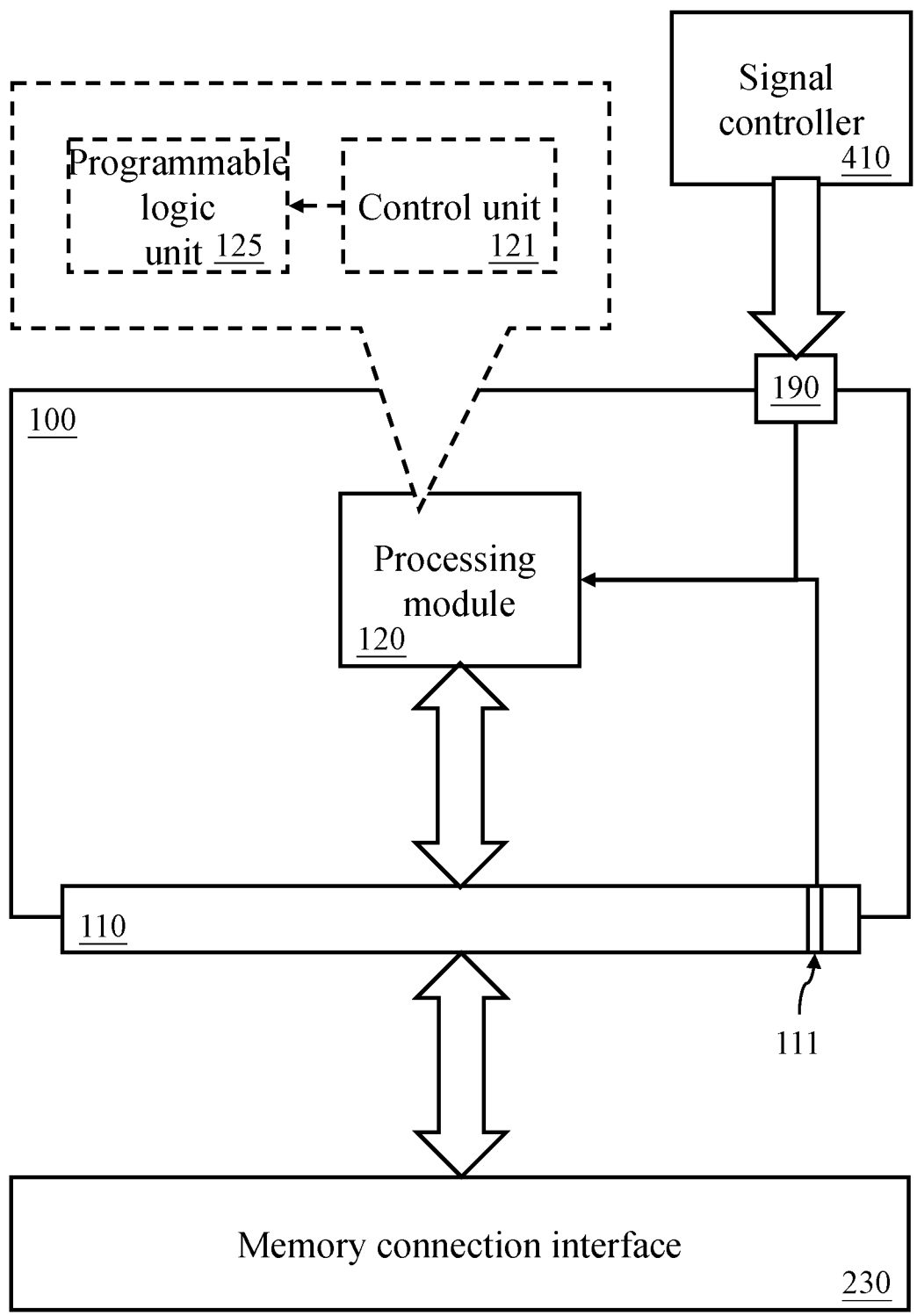
【Fig. 1】

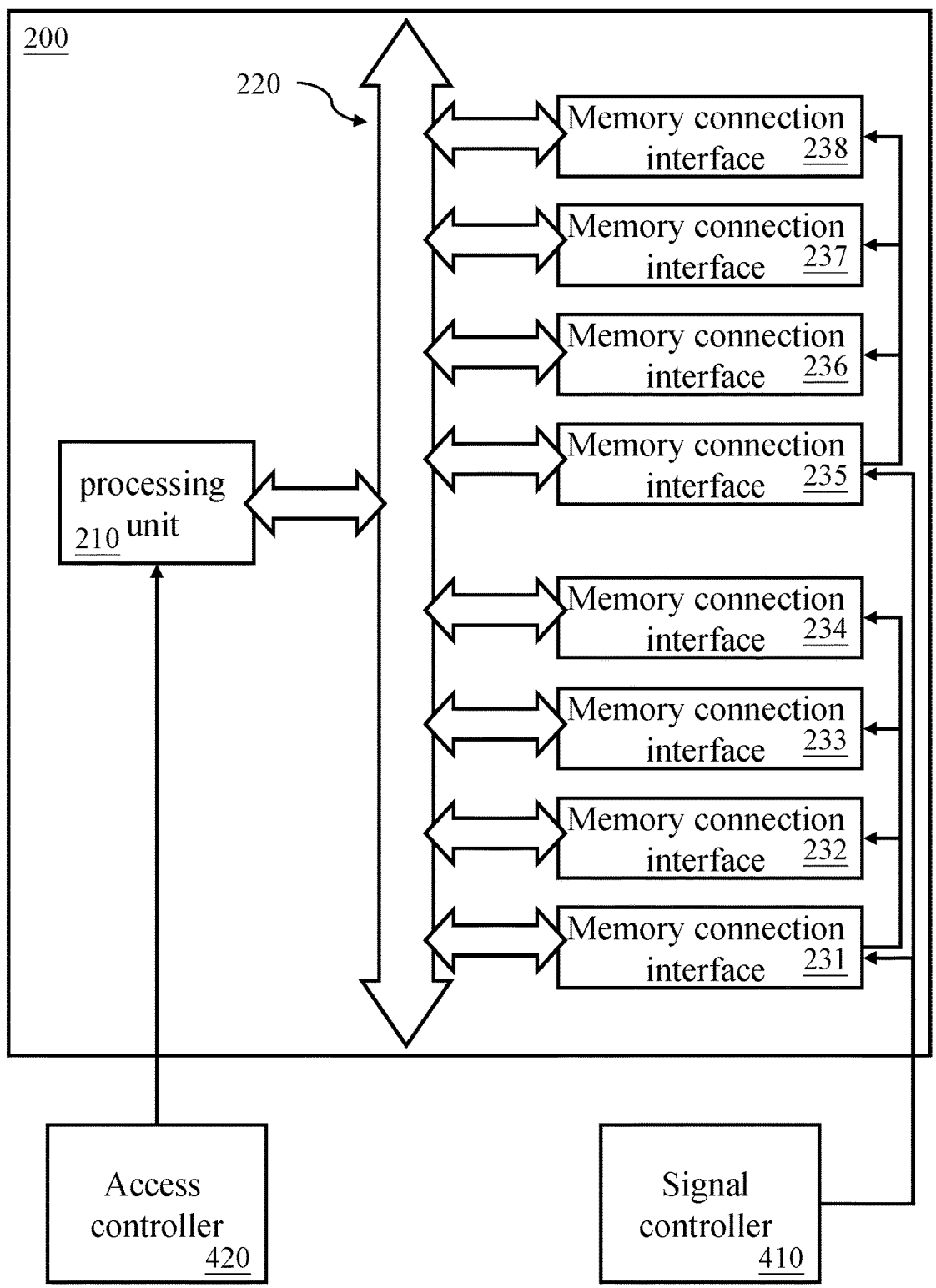
【Fig. 2】

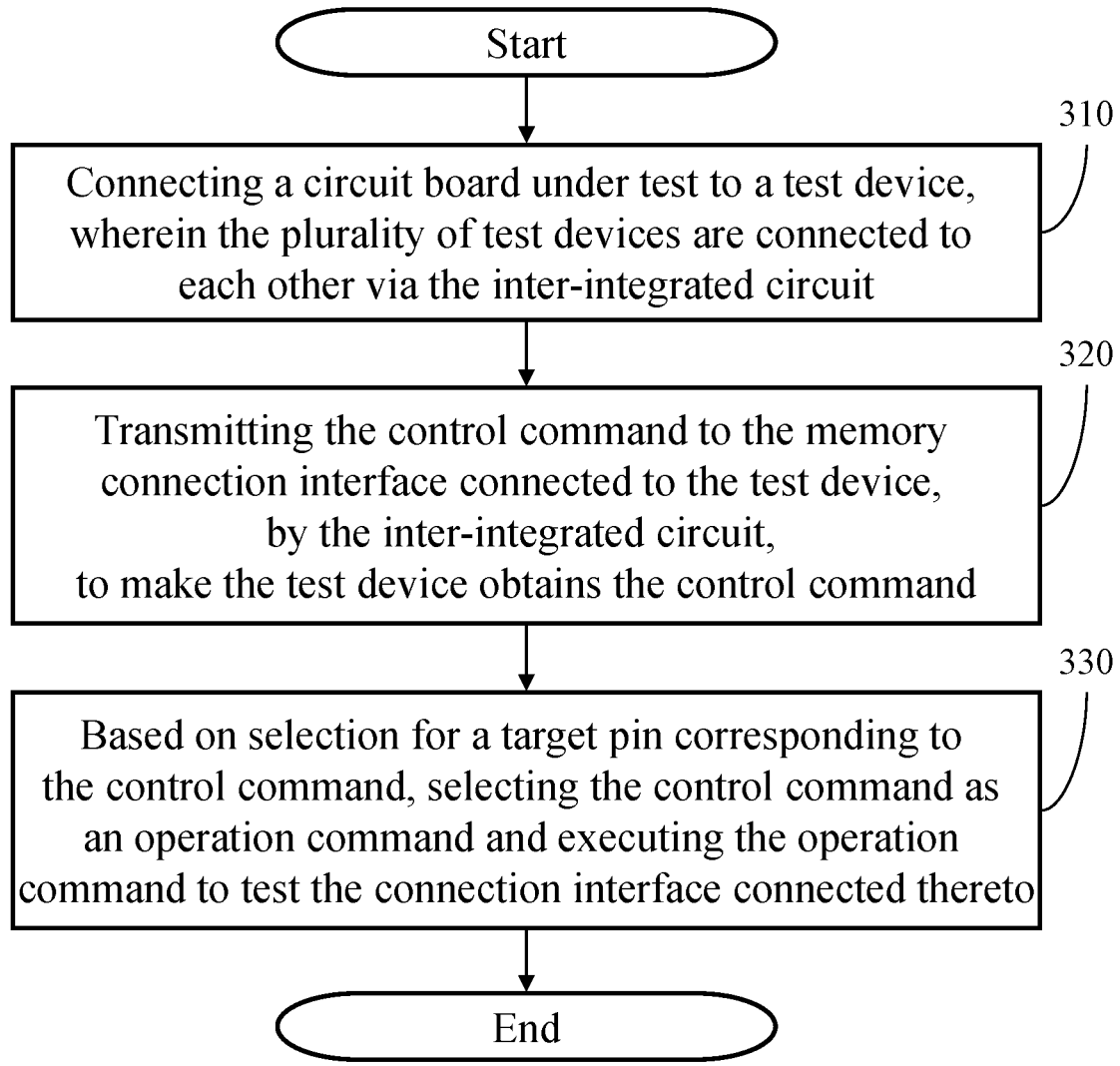
【Fig. 3A】

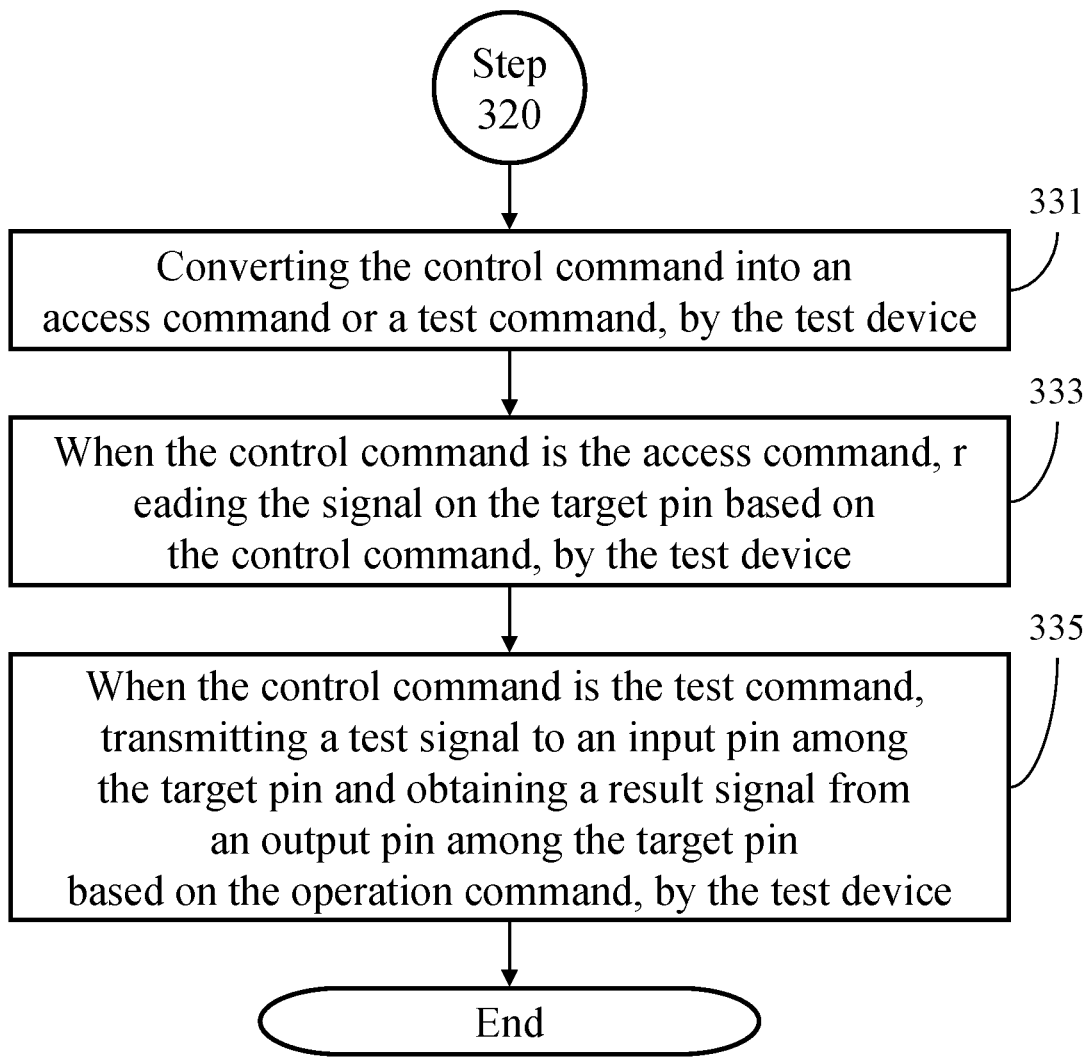
[Fig. 3B]

DEVICE FOR TRANSMITTING COMMANDS WITH CIRCUIT OF CIRCUIT BOARD TO TEST CONNECTION INTERFACE, SYSTEM AND METHOD THEREOF

BACKGROUND OF THE INVENTION

1. Field of the Invention

The present invention is related to a test device, a test system and a test method, and more particular to a device for transmitting commands with a circuit of a circuit board to test a connection interface, and a system and a method thereof.

2. Description of the Related Art

Industry 4.0 (also known as the fourth industrial revolution) is not just creation of new industrial technologies, but focuses on the integration of existing industrial technologies, sales processes and product experience, so as to build a smart factory with adaptability, resource efficiency and ergonomics through artificial intelligence (AI) technology, and integrate customers and business partners in the business process and value process to provide perfect after-sales service, thereby establishing a new intelligent industrial world with perception consciousness.

With the wave of the Industry 4.0 sweeping the world, manufacturers are all using smart manufacturing to optimize production transformation and enhance competitiveness. The smart manufacturing is to realize the intelligent product design, manufacturing, and enterprise management and service based on sensing technology, network technology, automation technology and AI through the processes of perception, human-computer interaction, decision-making, execution and feedback.

The electronic assembly industry has characteristics of small profits but quick turnover and fierce product price competition, so the manufacturers in the electronic assembly industry always pursue more effective control and optimization of raw materials and production tools, thereby maximizing the efficiency of factory production resources. For example, the production line of the electronic assembly industry includes many test stages for various circuit boards; the production line of motherboard includes the test stage for a memory connection interface on the motherboard.

One of the conventional testing methods for the memory connection interface on the motherboard is to use DummyDIMM as a test device to perform a boundary scan test on the memory connection interface. In order to perform the boundary scan test, the joint test action group (JTAG) ports of all test devices are connected to each other, so JTAG connection lines for boundary scan are required to set between the test devices.

However, in the actual situation, the space between the memory connection interface of the memory is small, so a connection interruption problem may occur during a long test when multiple JTAG connection lines are connected at the same time. Furthermore, since JTAG applies serial signals, when the amount of the JTAG ports increases, the total length of the JTAG connection lines becomes longer, so the data communication rate on the JTAG connection lines also decrease accordingly. Therefore, in the conventional testing methods, when the amount of the test devices on the memory connection interface of the memory increases, the JTAG communication rate is reduced, and it results in an increase in the test time.

Therefore, what is needed is to develop an improved technical solution to solve the above-mentioned problem that the connection status and test time are unstable when the boundary scan test on memory connection interface is performed with the JTAG connection lines.

SUMMARY OF THE INVENTION

An objective of the present invention is to disclose a device for transmitting commands with a circuit of a circuit board to test a connection interface, and a system and a method thereof to solve the conventional technology problem that the connection status and test time are unstable when a boundary scan test is performed on a memory connection interface with JTAG connection lines.

In order to achieve the objective, the present invention provides a device for transmitting commands with a circuit of a circuit board to test a connection interface, and the device includes at least one pin and a processing module. The at least one pin is configured to connect to a memory connection interface of a circuit board under test, and connect to an inter-integrated circuit of the circuit board under test via an memory connection interface, so that the device is connected to another device, which is connected to another memory connection interface of the circuit board under test via the inter-integrated circuit, wherein at least one pin is configured to receive a control command which is transmitted to the inter-integrated circuit. The processing module is connected to the at least one pin and configured to select the control command as an operation command or convert the control command into the operation command based on selection for a target pin corresponding to the control command, and then execute the operation command to test the memory connection interface.

In order to achieve the objective, the present invention provides a system for transmitting commands with a circuit of a circuit board to test a connection interface, and the system includes a circuit board under test and a plurality of test devices. The circuit board under test includes a plurality of memory connection interfaces and at least one inter-integrated circuit, wherein the plurality of memory connection interfaces are connected to each other via the at least one inter-integrated circuit, wherein when a control command is transmitted to the at least one inter-integrated circuit, the at least one inter-integrated circuit transmits the control command to the plurality of memory connection interfaces. Each of the plurality of test devices is connected to one of the plurality of memory connection interfaces, and each of the plurality of test devices comprises at least one pin, the pins of the plurality of test devices are connected to each other via the at least one inter-integrated circuit, and each of the plurality of test devices receives the control command via the at least one inter-integrated circuit, and selects the control command as an operation command or converts the control command into the operation command based on selection for a target pin corresponding to the control command, and executes the operation command to test a corresponding one of memory connection interfaces connected thereto.

In order to achieve the objective, the present invention provides a method for transmitting commands with a circuit of a circuit board to test a connection interface, and the method includes steps of: connecting a circuit board under test to a plurality of test devices, wherein the circuit board under test comprises a plurality of memory connection interfaces corresponding to the plurality of test devices, and comprises at least one inter-integrated circuit, each of the plurality of test devices is connected to a corresponding one of the memory connection interface, and each of the plurality of test devices comprises at least one pin, and the pins of the plurality of test devices are connected to each other via the at least one inter-integrated circuit; transmitting a control command to the at least one inter-integrated circuit; transmitting the control command to the memory connection interface, by the at least one inter-integrated circuit, wherein each of the plurality of test devices obtains the control command via the plurality of memory connection interfaces connected to each other; based on selection for a target pin corresponding to the control command, using the control command as an operation command or converting the control command into the operation command, and executing the operation command to test the corresponding one of the memory connection interface connected thereto, by each of the plurality of test devices.

According to above-mentioned device, system and method of the present invention, the difference between the present invention and the conventional technology is that the inter-integrated circuit (I2C) of the circuit board under test can be used to transmit the control command to the test device, which is connected to the inter-integrated circuit via the memory connection interface of the circuit board under test, the test device can convert the control command to test the memory connection interface connected thereto, so as to solve the conventional problem and achieve the technical effect of improving test efficiency.

BRIEF DESCRIPTION OF THE DRAWINGS

The structure, operating principle and effects of the present invention will be described in detail by way of various embodiments which are illustrated in the accompanying drawings.

FIG. 1 is a schematic view of components of a device for transmitting commands with a circuit of a circuit board to test a connection interface, according to the present invention.

FIG. 2 is a schematic view of components of a circuit board under test, according to the present invention.

FIG. 3A is a flowchart of a method for transmitting commands with a circuit of a circuit board to test a connection interface, according to the present invention.

FIG. 3B is a flowchart of a method for a test device to convert a control command to test a memory connection interface, according to the present invention.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

In the present invention, an existing inter-integrated circuit (I2C) bus (is also called inter-integrated circuit hereafter) of a circuit board under test are used to transmit a control command to a test device, which is connected to the circuit board under test, so that the test device is able to test the circuit board under test based on the control command. Wherein, the circuit board under test is a circuit board including a memory connection interface for providing dual in-line memory module (DIMM) connections, and the test device is usually a corresponding memory test device.

The operation of the system of the present invention will be illustrated with reference to FIG. 1 showing a schematic view of components of a device for transmitting commands with a circuit of a circuit board to test a connection interface and FIG. 2 showing a schematic view of components of a circuit board under test, according to the present invention. As shown in FIGS. 1 and 2, the system of the present invention includes a test device 100, a circuit board under test 200, a signal controller 410 and an access controller 420. In this embodiment, the access controller 420 is optional.

The test device 100 is connected to the memory connection interface 230 of the circuit board under test 200, and configured to test the memory connection interface 230 of the circuit board under test 200. Generally speaking, the test device 100 can perform a specific test operation and/or simulate the operation of the corresponding memory module, so as to test the connected memory connection interface 230.

In some embodiments, the test device 100 includes a connection member 110 and a processing module 120, and a connector 190. In this embodiment, the connector 190 is optional. The connection member 110 and the processing module 120, the connector 190 and the processing module 120, can be connected to each other via one or more circuits (no shown in figures) disposed on the test device 100.

The connection member 110 is a component of the test device 100 to connect to the memory connection interface 230 of the circuit board under test 200, and includes a plurality of pins, such as a pin 111 shown in FIG. 1. The positions of the pins on the connector 110 generally correspond to the positions of the pins of the memory module simulated by the test device 100.

The processing module 120 receives the control command via the connection member 110 or the connector 190, and then converts the received control command into an operation command and execute the operation command to test the memory connection interface 230 of the circuit board under test 200.

In some embodiments, the processing module 120 can include a control unit 121 and a programmable logic unit 125, but the present invention is not limited thereto. Any software and hardware or combination of software, firmware and hardware capable of completing the described functions of the control unit 121 and the programmable logic unit 125 can be used as the processing module 120. For example, the control unit 121 can be a microcontroller unit (MCU), the programmable logic unit 125 can be a complex programmable logic device (CPLD); however, the present invention is not limited to above-mentioned examples.

The control unit 121 receives the control command compatible with the internal integrated circuit through the connector 110 or the connector 190, converts the received control command into the operation command compatible with I2C or JTAG based on a target pin selection indicated by the control command. In more detail, when the target pin indicated by the control command is belonged to the pins of the inter-integrated circuit, the control unit 121 converts the control command into the access command corresponding to the programmable logic unit 125 and enabling the programmable logic unit 125 to access the target pin using the inter-integrated circuit, and when the target pin indicated by the control command is not belonged to the pins of the inter-integrated circuit (for example, the target pin is belonged to the pins for the boundary scan) or the signal on the target pin may change continuously over time, the control unit 121 can convert the control command, which has the format compatible with the inter-integrated circuit, to the corresponding simulated boundary scan device enables the programmable logic unit 125 to generate the test command using JTAG to test the target pin, such as the test command compatible with JTAG.

The control unit 121 can load and execute a prebuilt test program. In general, the test program is usually used for boundary scan test, but the present invention is not limited thereto. The control unit 121 can simulate a boundary scan component, so that after the test program is executed, a control command corresponding to the target pin and compatible with JTAG is issued to the boundary scan component simulated by the control unit 121. In this way, the control unit 121 can obtain the control command generated by the test program through the simulated boundary scan component, and can convert the obtained control command into an access command or directly use the obtained control command as a test command.

The programmable logic unit 125 executes the operation command generated by the control unit 121. In more detail, when the operation command is the access command, the programmable logic unit 125 generates an access signal that is compatible with the inter-integrated circuit based on the access command to access the target pin, and can transmit the access signal to the chip with the target pin through the inter-integrated circuit to obtain the signal on the corresponding target pin, or programmable logic unit 125 can provide the specific signal indicated by the access signal to the corresponding target pin. When the operation command is the test command, the programmable logic unit 125 transmits the test signal indicated by the test command to an input pin among the target pins and obtains a result signal from an output pin among the target pins via JTAG port on chip with target pins.

The connector 190 is compatible with the inter-integrated circuit, and configured to receive the control command transmitted by the signal controller 410; the connector 190 can be connected to the another test device, which is connected to another memory connection interface 230 of the circuit board under test 200.

The circuit board under test 200 includes a processing unit 210, a system bus 220, and a memory connection interface 230. In general, the circuit board under test 200 includes at least one memory connection interface, as shown in FIG. 2, the circuit board under test 200 includes eight memory connection interfaces 231~238. In an embodiment, the circuit board under test 200 can be a motherboard.

The processing unit 210 executes calculation and determination operations, and is connected to the memory connection interface 230 (such as the memory connection interfaces 231~238) via the system bus 220, and transmits data or signal to the memory connection interface 230 (such as the memory connection interfaces 231~238), receives the data or signal transmitted from the memory connection interface 230 (such as the memory connection interfaces 231~238) via the system bus 220, for example, the processing unit 210 transmits a control signal to specific memory connection interfaces 231~238.

The processing unit 210 receives the control signal transmitted from the access controller 420, and converts the received control signal into the corresponding control command, and transmits the control command to the memory connection interface 230.

In another embodiment, the processing unit 210 can be a central processing unit (CPU) or a microprocessor.

The memory connection interface 230 (such as the memory connection interfaces 231~238) can be connected to the processing unit 210 via the system bus 220, and also connected to the at least one inter-integrated circuit. In some embodiments, the memory connection interfaces 231~234 can be connected to each other via an inter-integrated circuit, and the memory connection interfaces 235~238 can be connected to each other via an inter-integrated circuit, and the memory connection interfaces 231~234 are not connected to the memory connection interfaces 235~238; however, the present invention is not limited to the above-mentioned example. For example, the memory connection interfaces 231~238 can be connected to each other via an inter-integrated circuit. In an embodiment, the memory connection interface 230 can be a memory connector.

The signal controller 410 is compatible with the inter-integrated circuit. In an embodiment, the signal controller 410 can be, for example, an inter-integrated circuit controller. The signal controller 410 generates and transmits the control command, and transmits the control command to the test device 100 via the inter-integrated circuit of the connector 190 directly connected to the test device 100.

The access controller 420 generates and transmits the control signal to the processing unit 210 of the circuit board under test 200. In another embodiment, the access controller 420 can be a test access port (TAP) controller.

The operating device and method of the present invention are described with reference to an embodiment in the following paragraphs. Please refer to FIG. 3A, which is a flowchart of a method for transmitting commands with a circuit of a circuit board to test a connection interface, according to the present invention. In this embodiment, the test device 100 is DummyDIMM and the circuit board under test 200 is a motherboard, but the present invention is not limited thereto.

First, in a step 310, test devices 100 are inserted into different memory connection interfaces 230 of the circuit board under test 200, respectively, so as to connect the circuit board under test 200 to the test devices 100. In this embodiment, the test devices 100 connected to the memory connection interfaces 231~234 of the circuit board under test 200 can be connected to each other via an inter-integrated circuit of the circuit board under test 200, and the test devices 100 connected to the memory connection interfaces 235~238 of the circuit board under test 200 can connected to each other via an inter-integrated circuit of the circuit board under test 200.

In a step 320, after the circuit board under test 200 is connected to the test device 100 (the step 310), the processing unit 210 of the circuit board under test 200 transmits the control command to the test device 100 via an inter-integrated circuit. In this embodiment, the processing unit 210 transmits the control command to the memory connection interface 231 and the memory connection interface 235 of the circuit board under test 200 via an inter-integrated circuit, so that the control command can be transmitted to the test devices 100 connected to the memory connection interfaces 231 and 235 via the memory connection interfaces 231 and 235, and in this case, the control command can also be respectively transmitted to the memory connection interfaces 232~234 and the memory connection interfaces 236~238 via the inter-integrated circuit connected to the memory connection interfaces 231 and 235, so that the test devices 100 connected to the memory connection interfaces 232~234 and 236~238 can receive the control command.

In a step 330, after the processing module 120 of the test device 100 receives the control command from the inter-integrated circuit connected to the memory connection interface 230, which is connected to the circuit board under test 200, the processing module 120 uses the control command as an operation command or converts the control command into the operation command based on selection for a target pin of the control command, and then executes the operation command to test the memory connection interface 230 connected to the test device 100. In this embodiment, the processing module 120 includes a control unit 121 and a programmable logic unit 125, as shown in FIG. 3B, in a step 331, after the control unit 121 receives the control command, the control unit 121 can select to convert the control command into an access command corresponding to the programmable logic unit 125 or convert the control command compatible with inter-integrated circuit into a test command compatible with JTAG through the included signal conversion logic layer, based on whether the target pin indicated by the control command is belonged to the inter-integrated circuit, and the control unit 121 can transmit the access command to the programmable logic unit 125 through the transmission channel corresponding to the inter-integrated circuit or transmits the test command to the programmable logic unit 125 through the transmission channel corresponding to the JTAG. In a step 333, when the control command is converted into the access command, the programmable logic unit 125 generates a corresponding access signal compatible with the inter-integrated circuit according to the access command to obtain the signal corresponding to the target pin from the chip having the target pin; for example, the programmable logic unit 125 obtains the signal of a ground (GND) pin. In a step 335, when the control command is converted into the test command, the programmable logic unit 125 transmits the test signal to an input pin among the target pins based on the test command via JTAG port, to obtain a result signal from an output pin among the target pins, that is, the programmable logic unit 125 can transmit the test signal and receive the result signal via an JTAG port on the chip with the target pin.

In addition, in the above embodiment, after the circuit board 200 under test is connected to the testing device 100 (step 310), the processing module 120 of the testing device 100 can also execute the testing program. In this embodiment, the test program uses JTAG to test the memory connection interface 230 of the circuit board under test 200, after the control unit 121 of the processing module 120 executes the test program, the control commands compatible with JTAG can be generated. The control unit 121 can obtain the control command generated by executing the test program through the boundary scan component simulated by the boundary scan simulation layer of the control unit 121, and can convert the obtained control command into the access command compatible with inter-integrate circuit or use the obtained control command as a test command according to the target pin corresponding to the control command. Afterwards, the control unit 121 can transmit the generated access command or the test command to the programmable logic unit 125 through a transmission channel corresponding to the inter-integrated circuit or JTAG. When the programmable logic unit 125 receives the access command through the transmission channel corresponding to the inter-integrated circuit, the programmable logic unit 125 can generate a corresponding access signal compatible with the inter-integrated circuit according to the received access command, so that the programmable logic unit 125 can obtain the signal of the target pin from the chip with the target pin through the inter-integrated circuit; when the programmable logic unit 125 receives the test command, the programmable logic unit 125 can transmit one or more test signals to the input pin of the target pin and can get one or more result signal from the output pin of the target pin through the JTAG port on the chip with the target pin according to the test command.

Therefore, the technical solution of the present invention uses the existing inter-integrated circuit of the circuit board under test to transmit the control command to the test device connected to the memory connection interface of the circuit board under test without using additional connection line outside the test device to transmit the control command.

According to the above-mentioned contents, the difference between the present invention and the conventional technology is that the inter-integrated circuit (I2C) of the circuit board under test is used to transmit the control command to the test device, which is connected to the inter-integrated circuit via the memory connection interface of the circuit board under test, the test device can convert the control command to test the memory connection interface connected thereto. As a result, the technical solution of the present invention is able to solve the conventional problem that the connection status and test time are unstable when the boundary scan test on memory connection interface is performed with JTAG connection lines, so as to achieve the technical effect of improving test efficiency.

Furthermore, the method of the present invention can be implemented by hardware, software or a combination thereof, and can be implemented in a computer system by a centralization manner, or by a distribution manner of different components distributed in several interconnect computer systems.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A system for transmitting commands with a circuit of a circuit board to test a connection interface, comprising:
   a circuit board under test, comprising a plurality of memory connection interfaces and at least one inter-integrated circuit, wherein the plurality of memory connection interfaces are connected to each other via the at least one inter-integrated circuit, wherein when a control command is transmitted to the at least one inter-integrated circuit, the at least one inter-integrated circuit transmits the control command to the plurality of memory connection interfaces; and
   a plurality of test devices, wherein each of the plurality of test devices is connected to one of the plurality of memory connection interfaces, and each of the plurality of test devices comprises at least one pin, the pins of the plurality of test devices are connected to each other via the at least one inter-integrated circuit, and each of the plurality of test devices receives the control command via the at least one inter-integrated circuit, and selects the control command as an operation command or converts the control command into the operation command based on selection for a target pin corresponding to the control command, and executes the operation command to test a corresponding one of memory connection interfaces connected thereto.

2. The system according to claim 1, wherein each of the plurality of test devices converts the operation command into an access command and obtains a signal of the target pin based on the access command when the target pin is belonged to the at least one inter-integrated circuit, and converts the control command into the operation command compatible with JTAG and transmits the test signal to an input pin among the target pin to obtain a result signal from an output pin among the target pin based on the operation command when the target pin is not belonged to the at least one inter-integrated circuit.

3. A device for transmitting commands with a circuit of a circuit board to test a connection interface, comprising:
   at least one pin, configured to connect to a memory connection interface of a circuit board under test, and connect to an inter-integrated circuit of the circuit board under test via an memory connection interface, so that the device is connected to another device, which is connected to another memory connection interface of the circuit board under test via the inter-integrated circuit, wherein at least one pin is configured to receive a control command which is transmitted to the inter-integrated circuit; and
   a processing module, connected to the at least one pin and configured to select the control command as an operation command or convert the control command into the operation command based on selection for a target pin corresponding to the control command, and then execute the operation command to test the memory connection interface.

4. The device according to claim 3, wherein the processing module comprises a control unit and a programmable logic unit, the control unit is configured to use the control command as the operation command when the target pin is belonged to the inter-integrated circuit, and convert the control command into the operation command compatible with JTAG when the target pin is not belonged to the inter-integrated circuit, wherein when the target pin is belonged to the inter-integrated circuit, the programmable logic unit converts the operation command into an access command and obtains a signal on the target pin based on the access command, wherein when the target pin is not belonged to the inter-integrated circuit, the programmable logic unit transmits the test signal to an input pin among the target pin and obtain a result signal from an output pin among the target pin based on the operation command.

5. The device according to claim 3, wherein the processing module is configured to simulate a boundary scan component, and when determining that the access command is the test command, the processing module converts the access command into the operation command corresponding to the inter-integrated circuit based on the boundary scan component.

6. The device according to claim 3, wherein the processing module is configured to load and execute a test program to test the memory connection interface.

7. A method of using a circuit transmission command of a circuit board to test a connection interface, comprising:
   connecting a circuit board under test to a plurality of test devices, wherein the circuit board under test comprises a plurality of memory connection interfaces corresponding to the plurality of test devices, and comprises at least one inter-integrated circuit, each of the plurality of test devices is connected to a corresponding one of the memory connection interface, and each of the plurality of test devices comprises at least one pin, and the pins of the plurality of test devices are connected to each other via the at least one inter-integrated circuit;
   transmitting a control command to the at least one inter-integrated circuit;
   transmitting the control command to the memory connection interface, by the at least one inter-integrated circuit, wherein each of the plurality of test devices obtains the control command via the plurality of memory connection interfaces connected to each other; and
   based on selection for a target pin corresponding to the control command, using the control command as an operation command or converting the control command into the operation command, and executing the operation command to test the corresponding one of the memory connection interface connected thereto, by each of the plurality of test devices.

8. The method according to claim 7, wherein the step of converting the control command into the operation command and executing the operation command to test the corresponding one of the plurality of memory connection interfaces connected thereto, by each of the plurality of test devices, further comprises:
   when the target pin is belonged to the inter-integrated circuit, converting the control command into an access command, and reading a signal on the target pin based on the access command; and
   when the target pin is not belonged to the inter-integrated circuit, converting the control command into the operation command compatible with JTAG, and transmitting the test signal to an input pin among the target pin and obtaining a result signal from an output pin among the target pin based on the operation command.

9. The method according to claim 7, wherein the step of converting the control command into the operation command by each of the plurality of test devices, further comprises:
   when the access command is determined as the test command, simulating a boundary scan component, and converting the access command into the operation command corresponding to the inter-integrated circuit based on the boundary scan component, by each of the plurality of test devices.

10. The method according to claim 7, wherein the step of transmitting the control command to the at least one inter-integrated circuit, further comprises:

transmitting the control command to the at least one inter-integrated circuit by a processing unit of the circuit board under test via a bus of the circuit board under test, or transmitting the control command to the at least one test device, by a signal controller connected to the at least one test device, so as to transmitting the control command to the at least one inter-integrated circuit via the at least one test device connected to the at least one inter-integrated circuit.

* * * * *